(12) United States Patent
Schulz-Harder

(10) Patent No.: US 6,207,221 B1
(45) Date of Patent: Mar. 27, 2001

(54) PROCESS FOR PRODUCING A METAL-CERAMIC SUBSTRATE AND A METAL-CERAMIC SUBSTRATE

(76) Inventor: Jürgen Schulz-Harder, Hugo-Dietz-Str. 32, D-91207, Lauf (DE)

( * ) Notice: Subject to any disclaimer, the term of this patent is extended or adjusted under 35 U.S.C. 154(b) by 0 days.

(21) Appl. No.: 09/498,647

(22) Filed: Feb. 7, 2000

Related U.S. Application Data

(63) Continuation-in-part of application No. 09/030,119, filed on Feb. 25, 1998, now abandoned.

(30) Foreign Application Priority Data

Mar. 1, 1997 (DE) .................................................. 197 08 363
Nov. 29, 1997 (DE) .................................................. 197 53 148

(51) Int. Cl.$^7$ ....................................................... B05D 5/12
(52) U.S. Cl. ................................. 427/96; 427/97; 101/129
(58) Field of Search .......................... 427/96, 97; 101/129

(56) References Cited

U.S. PATENT DOCUMENTS

| | | | |
|---|---|---|---|
| 4,959,507 | * 9/1990 | Tanaka et al. | 174/260 |
| 5,317,801 | * 6/1994 | Tanaka et al. | 29/830 |
| 5,561,321 | * 10/1996 | Hirano et al. | 257/700 |
| 5,676,855 | * 10/1997 | Schulz-Harder | 216/52 |

* cited by examiner

*Primary Examiner*—Brian K. Talbot
(74) *Attorney, Agent, or Firm*—Hoffman, Wasson & Gitler

(57) ABSTRACT

The invention relates to a novel process for producing a ceramic-metal substrate for electrical circuits in which a first or second metal coating is applied to a ceramic layer on both sides, specifically first metal coating in the form of a copper foil using the DCB process.

18 Claims, 4 Drawing Sheets

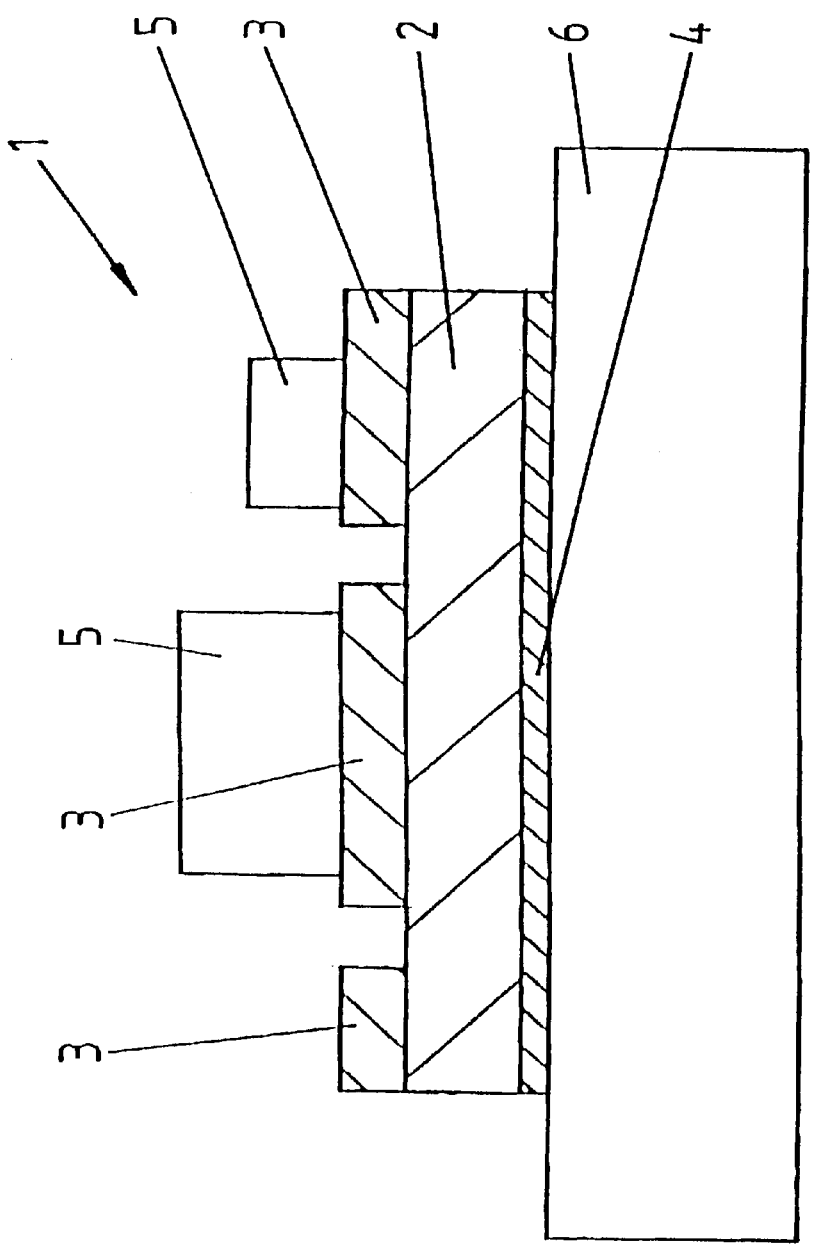

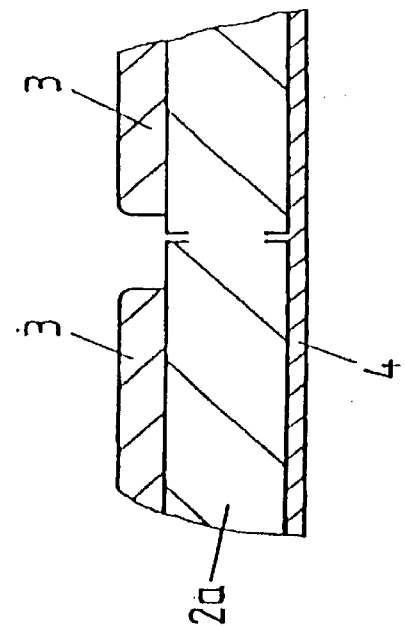
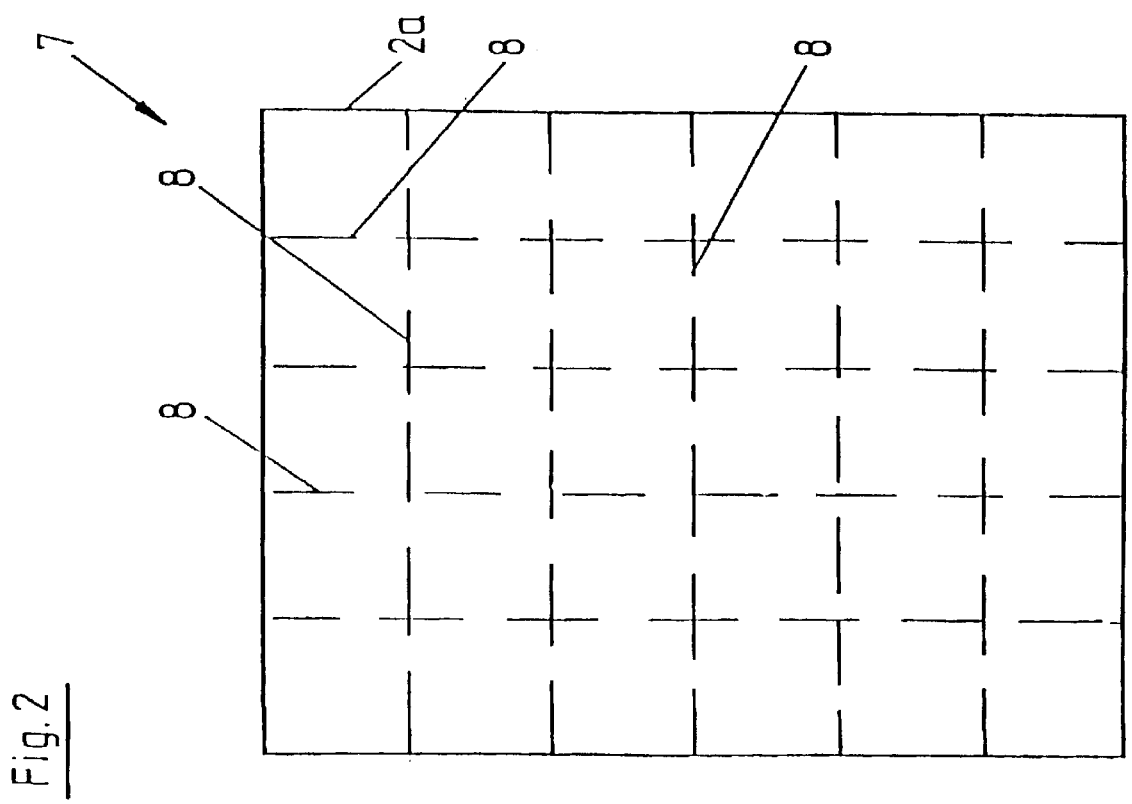

US 6,207,221 B1

PROCESS FOR PRODUCING A METAL-CERAMIC SUBSTRATE AND A METAL-CERAMIC SUBSTRATE

This application is a C-I-P of U.S. Ser. No. 09/030,119, filed Feb. 25, 1998, now abandoned.

BACKGROUND OF THE INVENTION

The invention relates to a process for producing a ceramic-metal substrate for electrical circuits.

Production of a metal coating necessary for producing printed conductors, terminals, etc., on a ceramic using the so-called DCB process (direct copper bond technology) is known. Copper foils are oxidized on their surfaces and form the metal coating. The copper oxide layer of these foils forms a eutectic with a melting point below the melting point of the copper, so that by applying the foils to the ceramic and by heating all the layers they can be joined to one another, by melting on the copper in the area of the oxide layer. The DCB process is a technique known to one skilled in the art which has the following process steps:

oxidation of a copper sheet such that a uniform copper oxide layer forms;

placing the copper sheet on the ceramic layer;

heating the combination to roughly 1071° C., for example;

cooling to room temperature.

The object of the invention is to devise a production process with which it is possible to produce metal-ceramic substrates for electric power circuits economically and also with optimum thermal properties.

SUMMARY OF THE INVENTION

In the substrates produced using the process as claimed in the invention, the second metal coating is produced using thick film or thin film technology. The second metal coating can be an intermediate layer which provides an improved thermal/or electrical transition between the ceramic layer and a metal base plate on which the substrate is located. The base plate is connected to a cooling body or a heat sink or can be a component of a heat sink. The connection between the substrate and the base plate can be a soldered connection. It is also possible to produce this connection by brazing. In the invention, the first metal coating is produced using DCB technology. The first metal coating forms the printed conductor contact surfaces, etc. and depending on the desired component can be textured.

BRIEF DESCRIPTION OF THE DRAWINGS

The invention is detailed below on embodiments using the figures.

FIG. 1 shows in a simplified representation and in cross section a substrate produced using the invention or an electrical circuit produced therewith;

FIG. 2 shows in a simplified representation and in an overhead view a multiple substrate with a host of individual substrates adjoining one another on scored lines;

FIG. 3 shows a section according to line I—I of FIG. 2;

DETAILED DESCRIPTION OF THE INVENTION

Figure 4:
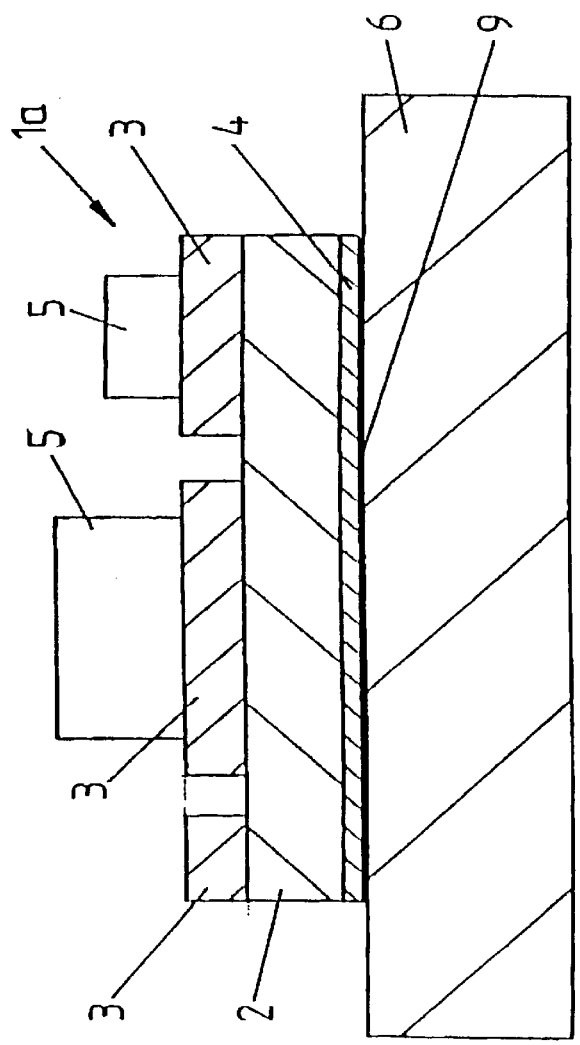
FIG. 4 shows in a representation similar to FIG. 1 another component or substrate produced as claimed in the invention.
Figure 5:
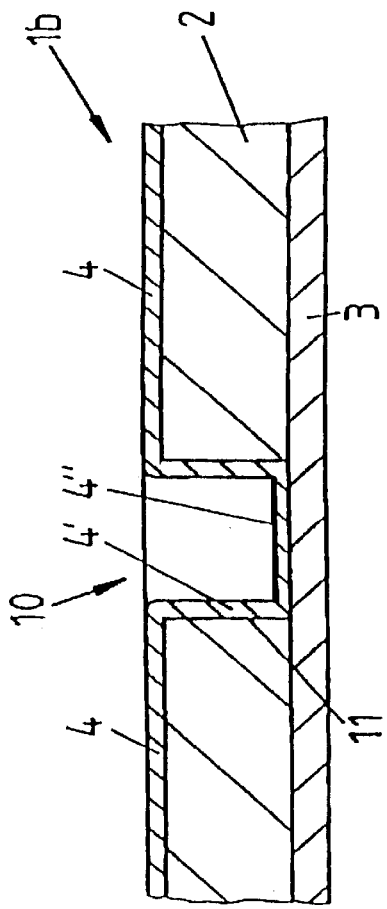
FIG. 5 shows in a simplified cross section another substrate produced using the invention.

In FIGS. 1–3, 1 labels an individual metal-ceramic substrate including a ceramic layer 2 (for example, aluminum nitride ceramic), an upper metal coating 3 which is provided superficially on the surface of the ceramic layer 2 and which is joined superficially thereto, and a lower metal coating 4 which is joined superficially to the bottom of the ceramic layer 2. The metal coating 3 can be textured to form printed conductors and contact surfaces for electronic components 5, of which at least one is a power component. A metal base plate 6 is provided which can be connected to a cooling body or used as a cooling body and the base plate adjoins the lower metal coating 4. The metal coatings 3 and 4 can be made of copper. Likewise, the base plate 6 can be made of copper. The metal coating 4 and individual substrate 1 is braced either with base plate 6 by a mechanical spring or by a bracing element not shown, or is soldered to the base plate 6.

Substrate 1 is produced in several process steps, first, the first metal coating is applied to one surface side of the ceramic layer which has a thickness between 0.2 and 2 mm using the DCB process. The first metal coating is a copper foil with a thickness from 0.1 to 6 mm.

In a subsequent process step then the copper layer which forms the first metal coating 3 can be textured to produce printed conductors, contact surfaces, etc., using known masking and etching techniques.

In another process step, a conductor paste is applied as a thin layer to the other surface side of the ceramic layer 2, in order to form the lower metal coating 4 with a thickness of roughly 0.01 to 0.1 mm. The conductor paste comprises, as a major component thereof, at least one of Cu, Ni, Cr, W, Mo and other metals, and further comprises a glass component in the form of glass powder or glass frit and further comprises a suitable organic binder (for example, acrylic resins, metacrylic resins or acrylate-metacrylate copolymer resin), as it is known in the prior art (U.S. Pat. No. 4,551,357). The base metal is used in the form of metal powder or small particles of metal. For example, a product from Dupont under the name "Low fire copper" is suitable for the conductor paste.

The paste is applied with a suitable technique, for example in screen printing, and then dried and fired in a nitrogen atmosphere at a temperature lower than the temperature of the DCB process to form the lower metal coating 4. The base metal in the conductor paste is needed for forming the metal of the metal coating 4. The glass component of the conductor paste is needed for affixing or bonding the metal coating 4 to the ceramic material of the ceramic layer 2. The organic binder in the conductor paste is needed for obtaining the paste construction and viscosity required when applying the paste to the surface side of the ceramic layer and for affixing the paste to the surface side of the ceramic layer duly drying and before firing.

In another process step, the exposed surfaces are cleaned both on the top and bottom of ceramic layer 2 by microetching. In doing so, oxides present, or residues of the paste used to produce metal coating 4, are removed.

In another process step, notably surface enhancement, nickel-plating of the exposed surfaces of the first metal coating 3, optionally, the second metal coating 4, can be done.

In the above described process, the thickness of the second metal coating 4 produced by thick film technique is intentionally kept smaller than the thickness of the first metal coating 3. The second metal coating 4 is used simply to produce a thermal and/or electrical transition which is as uniform as possible, i.e. which balances especially unevenness in the ceramic surface, between the individual substrate 1 and the base plate 6.

After cleaning by microetching and optionally after surface enhancement, assembly with a component 5 is done.

Individual substrates 1 are preferably produced in multiple printed panel 7, i.e. in the form of a multiple substrate which has a large area ceramic layer or a plate 2a which is provided with a plurality of scored lines 8. The multiple printed panel 7 can be separated into individual substrates 1 by breaking on these scored lines after completion and mounting.

On one surface side of the ceramic layer 2a, after applying a copper foil which forms the first metal coating 3 using the DCB process, and after corresponding texturing of this first metal coating, copper foil to form the individual layouts independent of one another for the individual substrates on the bottom of ceramic layer 2a, the paste is then applied over a large area to produce second metal coating 4. This paste is then dried and fired.

The scored lines are formed, for example, by notches or scratches which in the embodiment shown are opposite one another on the top and bottom of ceramic layer 2a and, for example, are produced mechanically or by a laser.

After completion of the multiple printed panel 7, i.e. after completion of aforementioned process steps and preferably also after assembly of individual substrates 1, the multiple substrates are then separated from one another by breaking the ceramic layer 2a along the scored lines. The second metal coating 4 is very thin and is relatively brittle so that breaking is possible even though the scored lines 8 are bridged by the lower second metal coating 4.

The application of the second metal coating 4, or the paste which forms with this coating, over a large area, is done by using a screen printing technique, and has the advantage that regardless of the size and formation of individual substrates 1, and especially regardless of the course and number of scored lines 8, for producing metal coatings 4, a standard screen can be used.

FIG. 4 shows a representation like FIG. 1, with another possible embodiment of a circuit with an individual substrate 1a. This individual substrate 1a contains a ceramic layer 2, two metal coatings 3 and 4, and on the side of the second metal coating 4 facing away from ceramic layer 2, a thin surface layer 9 is provided.

Individual substrate 1a is produced in a process with the following steps:

A conductor paste containing molybdenum (Mo), manganese (Mn) or tungsten (in the form of small particles or powder), a glass component (small glass particles or powdered glass) and suitable organic binder as known in the prior art (U.S. Pat. No. 4,551,357) is applied to a top side of the ceramic layer 2 with a thickness of 0.2 to 2 mm, for example, as a thin layer or as a thin film with a thickness from 0.005 to 0.01 mm. The layer is then dried and fired in a reducing, i.e. hydrogen-containing atmosphere at a temperature between 1200° C. to 1300° C.

In a subsequent process step, after possible cleaning of the ceramic layer 2, the application of a copper foil which forms the first metal coating 3 with a thickness from 0.1 to 0.6 mm, is done using the DCB process.

In a subsequent process step, the first metal coating, copper layer 3, is textured to form the layout for components 5 using conventional masking and etching techniques. Produced second metal coating 4 is not adversely affected during this texturing.

In another process step, the surfaces are cleaned by microetching.

In another process step, the second metal coating 4 is nickel-plated to form intermediate layer 9. The textured first metal coating 3 can also be nickel-plated. Individual substrate 1a can then be soldered on its bottom by thin intermediate layer 9.

FIG. 4 shows in a simplified representation, an individual substrate 1b which is made like substrate 1 of FIG. 1, i.e. includes a ceramic layer 2 and two metal coatings 3 and 4. Ceramic layer 2 in substrate 1b has a through plating 10 which is produced by an opening 11 in the ceramic layer 2 into which the paste used to produce the second metal coating 4 is introduced such that this paste or the second metal coating 4 formed by the paste continues at 4' on the edge of the opening and at 4" on the bottom of opening 11 and produces an electrical connection to first metal coating 3 which overlaps the opening.

Substrate 1b is produced with the same process steps using the same materials as production of substrate 1, i.e. in a first process step the copper foil which forms first metal coating 3 with a thickness from 0.1 to 0.6 mm is applied to ceramic layer 2 with a thickness in the range from roughly 0.2 to 2 mm using the DCB process, such that this copper foil or metal coating 3 also overlaps opening 11 on the surface side of ceramic layer 2. Then, the metal coating 3 is textured to form the layout for components 5. In another process step, the paste which forms the second copper metal coating 4 is applied to ceramic layer 2 which is oriented downward with first metal coating 3, such that this paste also forms edge area 4' and a bottom area 4". The printing screen used in the application of the paste is made accordingly for this purpose, for example such that the paste is also pressed into opening 11 in the desired manner. It is possible to introduce the paste into opening 11 using a dispenser.

After drying and firing the paste, surprisingly, not only is a connection established between the ceramic surfaces and the second metal coating formed by the paste, but also a connection between the two metal coatings 3 and 4 on the bottom of opening 11 is established.

Then, for example, the process steps described above, in conjunction with FIG. 1, for example follow firing of the paste which forms metal coating 4 can be practiced.

For example, the product from Dupont under the name "Series 6003-Low fire copper" is suitable as the paste.

Figure 6:
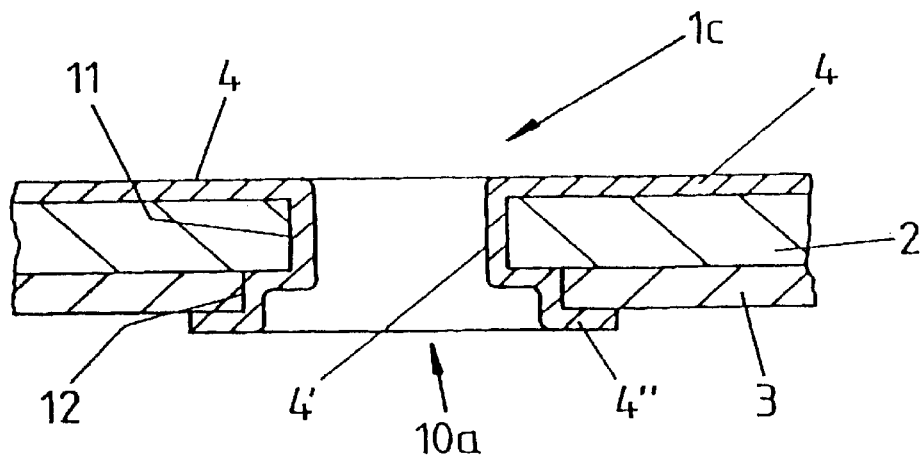
FIGS. 6 and 7 show in a simplified representation and in a section other possible embodiments of the substrate as claimed in the invention.

FIG. 6 shows in a simplified cross section substrate 1c, in which through plating 10a is produced by a first metal coating 3, in the area of through plating 10a having opening 12 which is congruent with opening 11 provided in the ceramic layer 2 for through plating 10a. The paste which forms the second metal coating 4 is then applied such that this paste covers not only edge area 4' of opening 11, but also extends as far as the side of ceramic layer 2 provided with first metal coating 3, there covers the edge of ceramic layer 2 surrounding opening 11 and also the area of metal coating 3 which surrounds opening 12.

Subsequently, the paste is dried and fired so that surprisingly a connection takes place not only between the ceramic surfaces and the second metal coating 4 formed by the paste, but also a connection between two metal coatings 3 and 4 in the area which surrounds opening 12, both on the edge of the metal coating 3 which surrounds opening 12 and also on the top facing away from ceramic layer 2 or on the edge area of metal coating 3 there.

Figure 7:
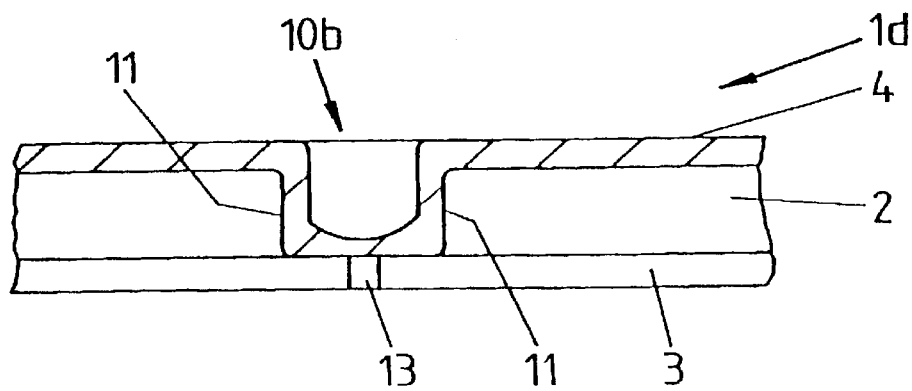

FIG. 7 shows substrate 1d which differs from substrate 1b only in that in the first metal coating 3, in the area of opening 11, there is at least one passage 13 which has a diameter which is very much smaller than opening 11 and is used solely for ventilation, so that the paste which forms the metal coating in the production of through plating 10b which corresponds to through-plating 10 can flow better into the opening 11, since the air which may be enclosed by the paste can escape downward through vent opening 13.

As is shown in FIG. 7, vent opening 13 is covered by the paste which forms metal coating 4 or section 4". The diameter of vent opening 13 is chosen with consideration of the viscosity of the paste used such that it does not flow out through opening 13 but also bridges vent opening 13 in the still viscous state.

The invention was described above using examples. It goes without saying that modifications and changes are possible.

As mentioned before, a conductor paste is used for making the metal layer 4 and the edge area 4' or the electrical through connection, which conductor paste does not only comprise at least one base metal of Cu, Ni, Cr, W, Mo, tungsten or other metals but also a glass component and a suitable organic binder, as for example disclosed in the U.S. Pat. No. 4,551,357. Especially in view of the glass component (glass powder or glass frit) it was very surprising and quite unexpected, that an electrical connection is obtained between the section 4" of the metal coating 4 and the metal coating 3 in the substrates 1b and 1c.

Reference number list

| | |
|---|---|
| 1, 1a, 1b | substrate |
| 1c, 1d | substrate |
| 2, 2a | ceramic layer |
| 3, 4 | metal coating |
| 4' | edge metal coating |
| 4" | bottom metal coating |
| 5 | component |
| 6 | base plate |
| 7 | multiple printed panel |
| 8 | scored line |
| 9 | intermediate layer |
| 10, 10a, 10b | through plating |
| 11 | opening |
| 12, 13 | opening |

What is claimed is:

1. A process for producing a ceramic-metal substrate for electrical circuits, said substrate having a ceramic layer and first and second metal coatings, each applied on one side to the ceramic layer and at least one through metal bonding provided in the area of at least one opening in the ceramic layer and connecting the first and second metal coatings, said process comprising:
applying a copper foil by using the DCB-process to one side of the ceramic layer as the first metal coating, and after that, forming the second metal coating by applying a conductor paste which contains at least the metal of the second metal coating, an organic binder and a glass component on to the other surface side of the ceramic layer and also into the at least one opening and on to a surface of the first metal coating which is exposed in said at least one opening or around said at least one opening, by drying and firing the applied conductor paste, the paste forming a glass layer between said ceramic layer and said second metal coating and no glass layer being formed between said second metal coating and said first metal coating.

2. A process for producing a multiple ceramic substrate arrangement comprising a plurality of individual substrates formed on a large-format ceramic plate, said process comprising:
applying the first metal coating in a form of a copper foil on one surface side of the ceramic plate using the DCB-process,
providing the ceramic plate with scored lines at least on the other surface side of the ceramic layer in between the individual substrate; and
applying a second metal coating to said other surface side of the ceramic plate in a thick film or thin film comprising the steps of:
applying a conductor paste which contains at least a metal of the second metal coating, an organic binder and a glass component to overlap all said scored lines and with a thickness much smaller than that of the first metal coating, and drying and firing the applied conductor paste.

3. A process for producing a ceramic-metal substrate for electric circuits, the substrate comprising a ceramic layer with first and second metal coatings each applied on one side of the ceramic layer and at least one through metal plating provided in an area of at least one opening in the ceramic layer and connecting the first and second metal coatings, the process comprising the steps of:
applying a copper foil to one side of the ceramic layer as the first metal coating by a direct copper bonding process;
after that applying the second metal coating to the other side of the ceramic layer and forming the at least one through metal plating using a paste, which contains a metal of the second metal coating an organic binder and a glass component to other side of the ceramic layer and said at least one through metal bonding in a one step in a thick film or thin film; and
applying the second metal coating into the at least one opening and onto a surface of the first metal coating which is exposed in the at least one opening.

4. A process for forming a ceramic-metal substrate for electrical circuits as claimed in claim 3, wherein the second metal coating which is applied to the other side of the ceramic layer has a thickness less than a thickness of the first metal coating and wherein an exposed surface of the second metal layer is joined to a metal base plate through electrical or thermal means.

5. The process for forming a ceramic-metal substrate for electrical circuits, as claimed in claim 3, wherein the first metal coating has a thickness ranging between 0.1 and 0.6 mm.

6. The process for forming a ceramic-metal substrate for electrical circuits, as claimed in claim 3, wherein the second metal coating is formed of a copper metal paste.

7. The process for forming a ceramic-metal substrate for electrical circuits, as claimed in claim 3, wherein the second metal coating has a thickness ranging from 0.01 to 0.1 mm.

8. The process for forming a ceramic-metal substrate for electrical circuits, as claimed in claim 3, wherein the first metal coating is textured and wherein the second metal coating is a paste which is dried and fired in a nitrogen atmosphere at a temperature lower than a temperature at which the direct copper bonding of said first metal coating occurs.

9. The process for forming a ceramic-metal substrate for electrical circuits, as claimed in claim 3, further comprising the step of finishing the second metal coating by cleaning an exposed surface of the second metal coating.

10. The process for forming a ceramic-metal substrate for electrical circuits, as claimed in claim 9, wherein the cleaning comprises removing oxides or residues by fine or microetching.

11. The process for forming a ceramic-metal substrate for electrical circuits, as claimed in claim 3, further comprising the step of nickel-plating on exposed surface of the first or second metal coating.

12. The process for forming a ceramic-metal substrate for electrical circuits, as claimed in claim 3, wherein the second metal coating is a paste formed of molybdenum, manganese or tungsten having a thickness ranging from 0.005 to 0.01 mm.

13. The process for forming a ceramic-metal substrate for electrical circuits, as claimed in claim 12, further comprising the steps of drying the paste at a temperature ranging from 1200° C. to 1300° C.; texturing the first metal coating and nickel-plating an exposed surface of the second metal coating.

14. The process for forming a ceramic-metal substrate for electrical circuits, as claimed in claim 13, further comprising the step of finishing the first metal coating by etching or microetching.

15. The process for forming a ceramic-metal substrate for electrical circuits, as claimed in claim 3, wherein a plurality of the ceramic-metal substrates are produced into a printed panel using a large ceramic plate having scored lines on one surface side over a large area with the second metal coating being applied to overlap the scored lines on an exposed surface of the ceramic layer over the large area.

16. The process for forming a ceramic-metal substrate for electrical circuits, as claimed in claim 3, wherein the ceramic metal substrate is joined to a metal base at an exposed surface of the second metal coating by soldering or brazing.

17. The process for forming a ceramic-metal substrate for electrical circuits, as claimed in claim 3, wherein the through metal plating is produced by applying the paste of the second metal coating through an opening in the ceramic layer and through the at least one opening which is also in the first metal coating such that the paste covers a region of said first metal coating adjacent to the opening for the through metal plating.

18. The process for forming a ceramic-metal substrate for electrical circuits, as claimed in claim 3, wherein there is provided a vent opening in the first metal coating in a region of the through metal plating.

* * * * *